United States Patent
Kim et al.

(10) Patent No.: US 8,742,248 B2
(45) Date of Patent: Jun. 3, 2014

(54) PHOTOELECTRIC CONVERSION MODULE AND METHOD OF MANUFACTURING THE SAME

(75) Inventors: Hyun-Chul Kim, Yogin-si (KR); Jung-Suk Song, Yogin-si (KR)

(73) Assignee: Samsung SDI Co., Ltd. (KR)

( * ) Notice: Subject to any disclaimer, the term of this patent is extended or adjusted under 35 U.S.C. 154(b) by 424 days.

(21) Appl. No.: 13/044,344

(22) Filed: Mar. 9, 2011

(65) Prior Publication Data

US 2011/0315198 A1      Dec. 29, 2011

(30) Foreign Application Priority Data

Jun. 24, 2010   (KR) ........................ 10-2010-0006095

(51) Int. Cl.
  *H02N 6/00*   (2006.01)
  *H01L 31/00*  (2006.01)
  *H01L 31/042* (2014.01)

(52) U.S. Cl.
  USPC ............ 136/244; 136/256; 136/263; 136/251

(58) Field of Classification Search
  USPC .................................. 136/251, 256, 263, 244
  See application file for complete search history.

(56) References Cited

U.S. PATENT DOCUMENTS

| | | | |
|---|---|---|---|
| 6,034,322 | A | 3/2000 | Pollard |
| 6,291,761 | B1 | 9/2001 | Takada et al. |
| 2004/0118444 | A1 | 6/2004 | Duggal et al. |
| 2009/0229596 | A1* | 9/2009 | Shin et al. ...................... 126/569 |
| 2010/0024875 | A1* | 2/2010 | Fukui et al. .................... 136/256 |
| 2010/0101633 | A1 | 4/2010 | Park et al. |

FOREIGN PATENT DOCUMENTS

| | | |
|---|---|---|
| JP | 2004-179260 A | 6/2004 |
| JP | 2004-327698 A | 11/2004 |

(Continued)

OTHER PUBLICATIONS

Korean Registration Determination Certificate issued Jan. 6, 2012 in related Korean Application No. KR 10-2010-0060095.
Extended European Search Report issued Jan. 2, 2013 in 11168262.1, which corresponds to the present application.

(Continued)

*Primary Examiner* — Jonathan Johnson
*Assistant Examiner* — Angelo Trivisonno
(74) *Attorney, Agent, or Firm* — Knobbe, Martens, Olson & Bear LLP

(57) ABSTRACT

A photoelectric conversion module and a method of manufacturing the same are disclosed. The photoelectric conversion module may include a light-receiving substrate in which a first functional layer having a photoelectrode is formed, a counter substrate that faces the light-receiving substrate and is electrically coupled to the light-receiving substrate and in which a second functional layer having a counter electrode is formed. The photoelectric conversion module may include a sealant formed between the light-receiving substrate and the counter substrate and positioned so as to divide a plurality of unit photoelectric cells formed between the light-receiving substrate and the counter substrate. The photoelectric conversion module may include a plurality of interconnection units electrically connecting adjacent unit photoelectric cells. The light-receiving substrate and the counter substrate may be divided into a photoelectric conversion area in which the unit photoelectric cells are formed, a sealing area in which the sealant is formed outside the photoelectric conversion area and a non-photoelectric conversion area outside of the sealing area. The interconnection units may be electrically connected to each other by a bypass unit, which may be configured to electrically connect a plurality of functional unit photoelectric cells and bypass a defective unit photoelectric cell.

8 Claims, 3 Drawing Sheets

(56) References Cited

FOREIGN PATENT DOCUMENTS

| | | |
|---|---|---|
| JP | 2007-220606 A | 8/2007 |
| JP | 2009-043482 A | 2/2009 |
| KR | 2004-0017504 A | 2/2004 |
| KR | 1020040080576 A | 9/2004 |
| KR | 1020080039873 A | 5/2008 |
| KR | 1020100051444 A | 5/2010 |
| WO | WO 2006/133507 A1 | 12/2006 |

OTHER PUBLICATIONS

Sastrawan, et al: "Interconnecting dye solar cells in modules-I-V characteristics under reverse bias", Journal of Photochemistry and Photobiology, A: Chemistry, Elsevier Sequoia, Lausanne, CH, vol. 178, No. 1, 28 February 2886 (2886-82-28), pp. 33-40, XP885263338, ISSN: 1818-6838, DOI: 18.1816/J.JPHOTOCHEM. 2885.86.817 p. 39, col. 1, lines 44-46.

\* cited by examiner

PHOTOELECTRIC CONVERSION MODULE AND METHOD OF MANUFACTURING THE SAME

CROSS-REFERENCE TO RELATED APPLICATIONS

This application claims the benefit of Korean Patent Application No. 10-2010-0060095, filed on Jun. 24, 2010, in the Korean Intellectual Property Office, the disclosure of which is incorporated herein by reference in its entirety.

BACKGROUND

1. Field of the Disclosure

The present disclosure relates to a photoelectric conversion module, and more particularly, to a photoelectric conversion module having an improved efficiency by bypassing defective photoelectric cells from among a plurality of photoelectric cells to connect non-defective photoelectric cells, and a method of manufacturing the same.

2. Description of the Related Technology

Research has recently been conducted on alternatives to fossil fuels, including solar cells and photoelectric conversion modules, which convert light into electric energy. Solar cells may have various driving principles. Wafer-type silicon or crystalline solar cells including p-n semiconductor junctions are generally used. However, manufacturing costs of wafer-type silicon or crystalline solar cells are high due to use of high purity semiconductor materials.

Unlike silicon solar cells, dye-sensitized solar cells (DSSCs) include a photosensitive dye for receiving light having a wavelength of visible light and generating excited electrons, a semiconductor material for receiving the excited electrons, and an electrolyte reacting with electrons from an external circuit. The DSSCs have a higher photoelectric conversion efficiency than conventional silicon solar cells and thus are regarded as next-generation solar cells.

Conventional silicon solar cells may electrically connect a plurality of photoelectric cells via an interconnection unit. However, defective photoelectric cells among several tens of photoelectric cells may function to maximize resistance—thus reducing efficiency of the photoelectric conversion module.

SUMMARY OF CERTAIN INVENTIVE ASPECTS

One or more embodiments of the present disclosure may include a photoelectric conversion module for preventing degradation of solar cell efficiency by bypassing defective photoelectric cells and electrically connecting functional photoelectric cells when defective photoelectric cells are generated.

In one aspect, a photoelectric conversion module includes, for example, a light-receiving substrate, a counter substrate that faces the light-receiving substrate and is electrically connected to the light-receiving substrate, a first functional layer formed on the light receiving substrate and positioned between the light receiving substrate and the counter substrate, the first functional layer having a photoelectrode, a second functional layer formed on the counter substrate and positioned between the counter substrate and the light receiving substrate, the second functional layer having a counter electrode, a sealant formed between the light-receiving substrate and the counter substrate, the sealant positioned to divide a plurality of unit photoelectric cells formed between the light-receiving substrate and the counter substrate and a plurality of interconnection units electrically connecting adjacent unit photoelectric cells.

In some embodiments, the light-receiving substrate and the counter substrate are divided into a photoelectric conversion area in which the unit photoelectric cells are formed, a sealing area in which the sealant is formed and which is outside the photoelectric conversion area, and a non-photoelectric conversion area outside of the sealing area. In some embodiments, at least two of the plurality of interconnection units are electrically connected to each other by a bypass unit, which is positioned to electrically bypass a defective unit photoelectric cell. In some embodiments, the interconnection unit includes a first interconnection unit configured for electrically connecting a first unit photoelectric cell counter electrode and a second unit photoelectric cell photoelectrode adjacent to the first unit photoelectric cell counter electrode, and a second interconnection unit configured for electrically connecting a second unit photoelectric cell counter electrode and a third unit photoelectric cell photoelectrode adjacent to the second unit photoelectric cell counter electrode.

In some embodiments, the first interconnection unit is formed in a Z shape. In some embodiments, when the second unit photoelectric cell is defective, the first interconnection unit formed between the first unit photoelectric cell and the second unit photoelectric cell and the second interconnection unit formed between the second unit photoelectric cell and the third unit photoelectric cell are electrically connected to each other by the bypass unit. In some embodiments, the first interconnection unit and the second interconnection unit are formed from any one of the light-receiving substrate and the counter substrate to the sealing area. In some embodiments, ends of the bypass unit overlap with the first interconnection unit and the second interconnection unit in the sealing area so as to electrically connect the first interconnection unit and the second interconnection unit. In some embodiments, a bypass hole is formed in any one of the light-receiving substrate and the counter substrate so as to correspond to the bypass unit.

In some embodiments, the first interconnection unit and the second interconnection unit extend from any one of the light-receiving substrate and the counter substrate through the sealing area to the non-photoelectric conversion area outside of the sealing area. In some embodiments, ends of the bypass unit overlap with the first interconnection unit and the second interconnection unit in the non-photoelectric conversion area so as to electrically connect the first interconnection unit and the second interconnection unit. In some embodiments, the bypass unit includes an Ag paste. In some embodiments, the sealant includes first sealants formed around the plurality of unit photoelectric cells, and second sealants formed between adjacent unit photoelectric cells. In some embodiments, the first functional layer includes a first transparent conductive layer patterned on the light-receiving substrate and a semiconductor layer formed on the first transparent conductive layer. In some embodiments, the second functional layer includes a second transparent conductive layer patterned on the counter substrate and a catalyst layer formed on the second transparent conductive layer.

In another aspect, a method of manufacturing a photoelectric conversion module includes, for example, assembling a photoelectric conversion module in which a plurality of unit photoelectric cells electrically connected to one another are formed, determining whether a defective unit photoelectric cell exists among the plurality of photoelectric cells and when a defective unit photoelectric cell exists, electrically connecting functional unit photoelectric cells to one another via a bypass unit to bypass the defective unit photoelectric cell.

In some embodiments, the electrically connecting the functional unit photoelectric cells to one another via the bypass unit includes, for example, forming a bypass hole in any one of a light-receiving substrate in which a plurality of unit photoelectric cells are arranged and a photoelectrode is formed, and a counter substrate facing the light-receiving substrate and in which a counter electrode is formed and electrically connecting a plurality of interconnection units to a plurality of functional unit photoelectric cells to one another by injecting a conductive material through the bypass hole to bypass a defective unit photoelectric cell. In some embodiments, the bypass unit electrically connects the plurality of interconnection units to one another in an area where a sealant is formed, and which is outside an area where the unit photoelectric cells are arranged. In some embodiments, the electrically connecting the functional unit photoelectric cells to one another via the bypass unit includes electrically connecting the plurality of interconnection unit to the plurality of functional unit photoelectric cells by injecting a conductive material into a space between the light-receiving substrate in which the unit photoelectric cells are arranged and the photoelectrode is formed, and the counter substrate facing the light-receiving substrate and in which the counter electrode is formed to bypass the defective unit photoelectric cell.

In some embodiments, the bypass unit electrically connects the plurality of interconnection units to one another in a non-photoelectric conversion area, which is outside of the area where the sealant is formed around the unit photoelectric cells. In some embodiments, the plurality of unit photoelectric cells are successively arranged between the light-receiving substrate including the photoelectrode and the counter substrate facing the light-receiving substrate and including the counter electrode. In some embodiments, the interconnection unit includes a first interconnection unit formed between a first photoelectric cell and a second photoelectric cell adjacent to the first photoelectric cell and a second interconnection unit between the second photoelectric cell and a third photoelectric cell adjacent to the second photoelectric cell. In some embodiments, the first interconnection unit electrically connects a counter electrode of the first unit photoelectric cell and a photoelectrode of the second unit photoelectric cell. In some embodiments, a second interconnection unit electrically connects a counter electrode of the second unit photoelectric cell and a photoelectrode of the third unit photoelectric cell.

BRIEF DESCRIPTION OF THE DRAWINGS

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus, system or method according to some of the described embodiments can have several aspects, no single one of which necessarily is solely responsible for the desirable attributes of the apparatus, system or method. After considering this discussion, and particularly after reading the section entitled "Detailed Description of Certain Inventive Embodiments" one will understand how illustrated features serve to explain certain principles of the present disclosure.

DETAILED DESCRIPTION OF CERTAIN INVENTIVE EMBODIMENTS

Figure 1:
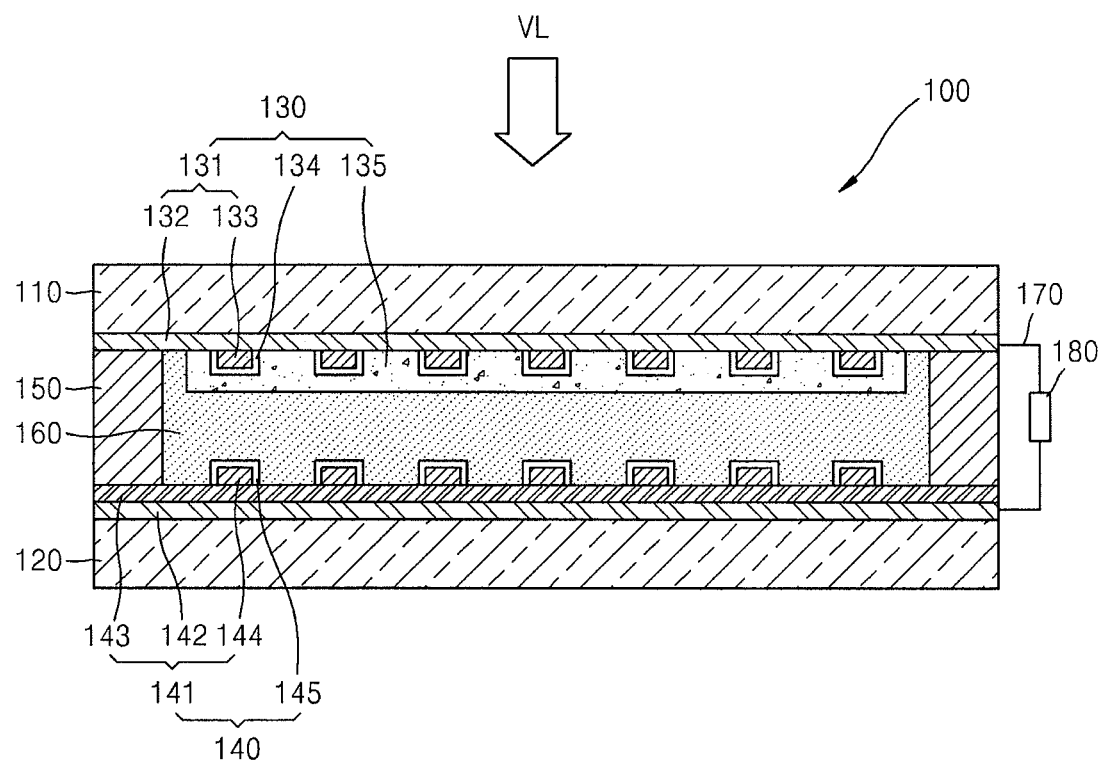
FIG. 1 is a cross-sectional view illustrating a unit photoelectric cell, according to an embodiment of the present disclosure.

In the following detailed description, only certain exemplary embodiments of the present invention have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements. Certain embodiments will be described in more detail with reference to the accompanying drawings, so that a person having ordinary skill in the art can readily make and use aspects of the present disclosure.

FIG. 1 is a cross-sectional view illustrating one embodiment of a unit photoelectric cell 100. Referring to FIG. 1, the unit photoelectric cell 100 includes a light-receiving substrate 110 and a counter substrate 120 that face each other. First and second functional layers 130 and 140 are formed on the light-receiving substrate 110 and the counter substrate 120, respectively. The first functional layer 130 is formed on an inner surface of the light-receiving substrate 110 and includes a photoelectrode 131 and a semiconductor layer 135. The second functional layer 140 is formed on an inner surface of the counter substrate 120 and includes a counter electrode 141. An electrolyte 160 is formed between the first functional layer 130 and the second functional layer 140. The photoelectrode 131 and the counter electrode 141 are each electrically connected to a lead 170 and are electrically connected to each other through an external circuit 180. However, in a configuration in which a plurality of photoelectric conversion devices are connected to one another in series or in parallel as modules, the photoelectrode 131 and the counter electrode 141 are electrically connected to each other in series or in parallel, such that ends of a connection portion may be electrically connected to the external circuit 180.

The light-receiving substrate 110 may be formed of a transparent material. The light-receiving substrate 110 may be formed of a material having a high light transmittance. For example, the light-receiving substrate 110 may include a glass substrate or a resin film. Since resin films have flexibility, a resin film may be suitable for flexible uses of the photoelectric cell. The photoelectrode 131 includes a first transparent conductive layer 132. The first transparent conductive layer 132 may be formed of a transparent or semi-transparent material having electrical conductivity. For example, the first transparent conductive layer 132 may be formed of a transparent conducting oxide (TCO) layer such as an indium tin oxide (ITO) layer, a fluorine-doped tin oxide (FTO) layer, or an antimony-doped tin oxide (ATO) layer. The photoelectrode 131 may further include a first grid pattern 133 formed on the first transparent conductive layer 132. The first grid pattern 133 is formed to reduce electric resistance of the first transparent conductive layer 132. The first grid pattern 133 may function as a lead for receiving electrons generated due to photoelectric conversion and may provide a low resistance current path. For example, the first grid pattern 133 may be formed of a metal having excellent electrical conductivity such as gold (Au), silver (Ag), or aluminum (Al). The first grid pattern 133 may be patterned in a mesh fashion, but the present disclosure is not limited thereto.

First protection layers 134 may be formed on outer surfaces of the first grid patterns 133. The first protection layers 134 may be configured to prevent electrode damage by, for example, preventing the first grid patterns 133 from contacting the electrolyte 160. Preventing contact between the first grid patterns 133 and the electrolyte 160 may prevent corrosion of the first grid patterns 133. The first protection layers 134 may be formed of a material that does not react with the electrolyte 160. For example, the first protection layers 134 may be formed of a curable resin material.

The photoelectrode 131 may be configured to function as a negative electrode of a photoelectric conversion device and may have a high aperture ratio. Light VL incident on the semiconductor layer 135 through the photoelectrode 131 functions as an excitation source of a photosensitive dye absorbed in the semiconductor layer 135. Accordingly, a photoelectric conversion efficiency of the unit photoelectric cell 100 may be improved by increasing an amount of the incident light VL.

The semiconductor layer 135 may be a metallic oxide formed of a semiconductor material, for example, of an element such as cadmium (Cd), zinc (Zn), indium (In), lead (Pb), molybdenum (Mo), tungsten (W), antimony (Sb), titanium (Ti), silver (Ag), manganese (Mn), tin (Sn), zirconium (Zr), strontium (Sr), gallium (Ga), silicon (Si), or chromium (Cr). The photoelectric conversion efficiency of the unit photoelectric cell 100 may be increased by the photosensitive dye absorbed therein. For example, the semiconductor layer 135 may be formed with a paste in which semiconductor particles having diameters of about 5 nm to about 1000 nm are dispersed. The paste may be coated on the light-receiving substrate 110 on which the photoelectrode 131 is formed. The coated paste is then heated or pressed.

The semiconductor layer 135 may absorb the photosensitive dye excitable by the light VL. The photosensitive dye in the semiconductor layer 135 absorbs the light VL incident on the semiconductor layer 135 through the light-receiving substrate 110, and electrons of the photosensitive dye are excited from a ground state to an excitation state. The excited electrons are transferred to a conduction band of the semiconductor layer 135 using an electrical contact between the photosensitive dye and the semiconductor layer 135. The electrons thus reach the photoelectrode 131 via the semiconductor layer 135 and are output via the photoelectrode 131, thereby forming a driving current for driving the external circuit 180. The photosensitive dye absorbed by the semiconductor layer 135 may include molecules that absorb visible light VL and rapidly transfer electrons to the semiconductor layer 135 in an optical excitation state. The photosensitive dye may be in the form of a liquid, a gel, or a solid. For example, the photosensitive dye absorbed in the semiconductor layer 135 may be a ruthenium (Ru)-based photosensitive dye. The photosensitive dye may be absorbed into the semiconductor layer 135 by dipping the light-receiving substrate 110 on which the semiconductor layer 135 is formed into a solution containing the photosensitive dye.

The electrolyte 160 may be formed of a redox electrolyte including an oxidant and reductant pair. The electrolyte 160 may be a solid, a gel, or a liquid.

The counter substrate 120 facing the light-receiving substrate 110 may not be transparent. However, the counter substrate 120 may be formed of a transparent material, and more particularly, may be formed of the same material as the light-receiving substrate 110. In this case, the light VL may be received from both sides, and thus, the photoelectric conversion efficiency of the unit photoelectric cell 100 may be increased. In particular, when the photoelectric conversion device is used for building integrated photovoltaic (BIPV) installed in a structure, for example, a window frame, both sides of the photoelectric conversion device may have transparency so as not to block the light VL passing through the window.

The counter electrode 141 formed on the counter substrate 120 includes a second transparent conductive layer 142 and a catalyst layer 143. The second transparent conductive layer 142 may be formed of a material having transparency and electrical conductivity. For example, the second transparent conductive layer 142 may be a TCO layer such as an ITO layer, an FTO layer, or an ATO layer. The catalyst layer 143 may be formed of a material having a reduction catalyst function for providing electrons to the electrolyte 160. For example, the catalyst layer 143 may be formed of a metal such as platinum (Pt), Au, Ag, copper (Cu) or Al, a metal oxide such as tin oxide (SnO), or a carbon (C)-based material such as graphite. The counter electrode 141 may further include a plurality of second grid patterns 144 formed on the second transparent conductive layer 142. The catalyst layer 143 may be formed between the second transparent conductive layer 142 and the second grid pattern 144. Alternatively, the second grid patterns 144 may be formed directly on the second transparent conductive layer 142. Second protection layers 145 may further be formed on outer surfaces of the second grid patterns 144.

The counter electrode 141 functions as a positive electrode of the photoelectric conversion device, and performs a reduction catalyst function for providing electrons to the electrolyte 160. The photosensitive dye absorbed in the semiconductor layer 135 is excited by absorbing the light VL, and excited electrons are output via the photoelectrode 131. Meanwhile, the photosensitive dye having lost electrons is reduced by electrons provided when the electrolyte 160 is oxidized, and the oxidized electrolyte 160 is reduced by electrons that reach the counter electrode 141 via the external circuit 180, thereby completing the circuit of the photoelectric conversion device.

Figure 2:
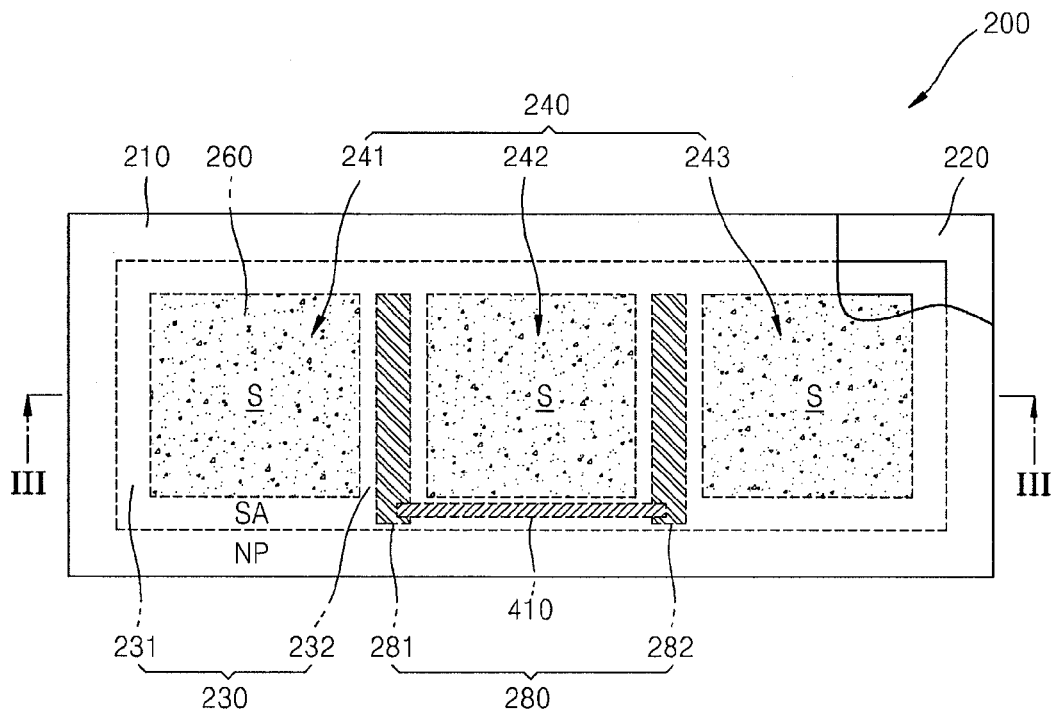
FIG. 2 is a plane view illustrating a photoelectric conversion module including a plurality of unit photoelectric cells, according to an embodiment of the present disclosure.
Figure 3:
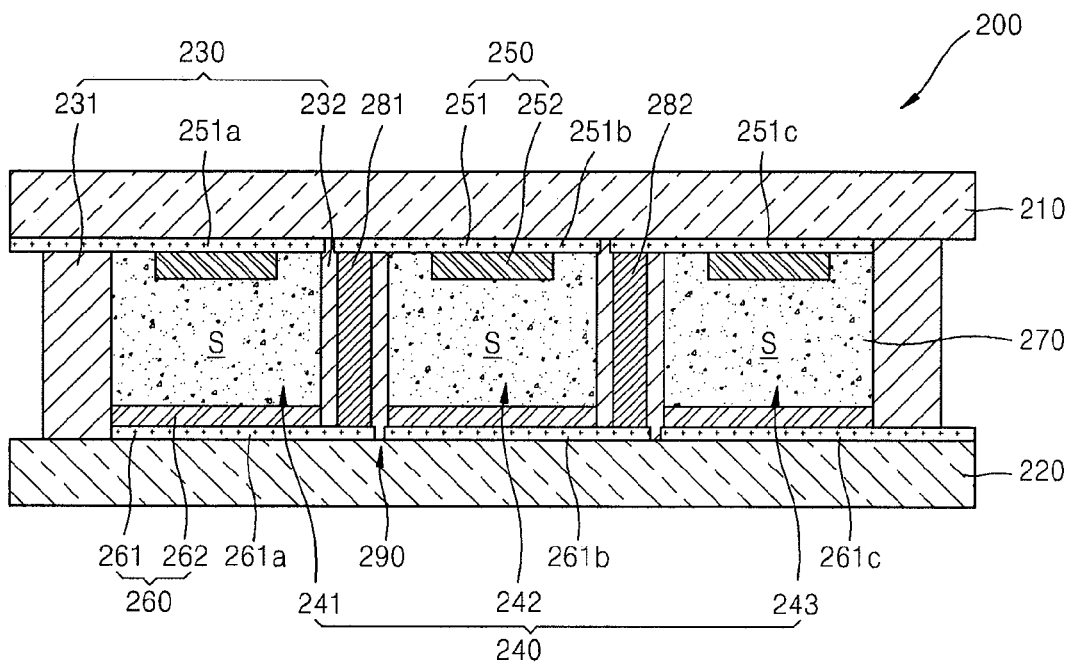
FIG. 3 is a cross-sectional view taken along a line III-III of FIG. 2.

FIG. 2 is a plane view illustrating a photoelectric conversion module 200 including a plurality of unit photoelectric cells. FIG. 3 is a cross-sectional view taken along a line III-III of FIG. 2. Referring to FIGS. 2 and 3, the photoelectric conversion module 200 includes a light-receiving substrate 210 and a counter substrate 220 that face each other. A plurality of photoelectric cells 240 divided by a sealant 230 are formed between the light-receiving substrate 210 and the counter substrate 220. In the illustrated embodiment, each photoelectric cell 240 includes three unit photoelectric cells S, that is, a first unit photoelectric cell 241, a second unit photoelectric cell 242, a third unit photoelectric cell 243. However, the number of unit photoelectric cells S may vary as desired according to the design of the photoelectric conversion module 200.

A first functional layer 250 is formed on an inner surface of the light-receiving substrate 210, and a second functional layer 260 is formed on an inner surface of the counter substrate 220. The first functional layer 250 includes a photoelectrode 251 functioning as a negative electrode, and a semiconductor layer 252 formed on the photoelectrode 251. The photoelectrode 251 may include a first transparent conductive layer, for example, a TCO layer, and a first grid pattern formed of a metal having excellent conductivity to reduce an electric resistance of the first transparent conductive layer. The first grid pattern may be formed in a stripe fashion or a mesh fashion.

Scribing lines 290 may be configured for insulating the unit photoelectric cells S from one another. The scribing lines 290 are formed in the photoelectrode 251 formed in the first unit photoelectric cell 241, the second unit photoelectric cell 242, and the third unit photoelectric cell 243. The scribing lines 290 may be formed using a laser scribing method.

The second functional layer 260 includes a counter electrode 261 functioning as a positive electrode of a photoelectric conversion device, and a catalyst layer 262 formed on the counter electrode 261. The catalyst layer 262 may be formed of Pt to have a reduction catalyst function. The counter electrode 261 includes a second transparent conductive layer, for example, a TCO layer, and a second grid pattern formed of a metal having excellent conductivity so as to reduce an electric resistance of the second transparent conductive layer. The second grid pattern may be formed in a stripe fashion or a mesh fashion.

The sealant 230 includes first sealants 231 formed around the first through third unit photoelectric cells 241 through 243, and second sealants 232 formed between the first unit photoelectric cell 241, the second unit photoelectric cell 242, and the third unit photoelectric cell 243. The first sealant 231 may be integrally formed with the second sealant 232. Thus, the first through third unit photoelectric cells 241 through 243 may be separated from each other.

An electrolyte 270 at least partially fills the first through third unit photoelectric cells 241 through 243. The first sealants 231 and the second sealants 232 surround the electrolyte 270 and seal the electrolyte 270 to prevent leakage of the electrolyte 270.

The first through third unit photoelectric cells 241 through 243 may be connected to one another in series by an interconnection unit 280. The interconnection unit 280 may be formed between adjacent unit photoelectric cells S, and may be formed in a space between the second sealants 232 dividing the unit photoelectric cells S. The interconnection unit 280 electrically connects the photoelectrode 251 of the adjacent unit photoelectric cells S and the counter electrode 261 to each other. For this, a counter electrode 261a of the first unit photoelectric cell 241 and a photoelectrode 251b of the adjacent second unit photoelectric cell 242 are electrically connected to each other by a first interconnection unit 281. A counter electrode 261b of the second unit photoelectric cell 242 and a photoelectrode 251c of the third unit photoelectric cell 243 are electrically connected to each other by a second interconnection unit 282.

As such, in the plurality of unit photoelectric cells S, the plurality of photoelectrodes 251b and 251c are formed on the light-receiving substrate 210, the plurality of counter electrodes 261a and 261b are formed on the counter substrate 220, and the counter electrodes 261a through 261b and the photoelectrodes 251b through 251c are connected to each other by the first and second interconnection units 281 and 282, respectively, thereby configuring the Z-type photoelectric conversion module 200.

As conventionally practiced in the art, when defective unit photoelectric cells are generated during assembling or testing of the photoelectric conversion module 200, the photoelectric conversion module 200 is discarded, or if not discarded, the defective unit photoelectric cells create undue resistance, thereby reducing efficiency of the photoelectric conversion module 200. However, in the current embodiment of the present disclosure, functional unit photoelectric cells are electrically connected to one another by bypassing defective unit photoelectric cells, which will be described in detail below.

Figure 4:
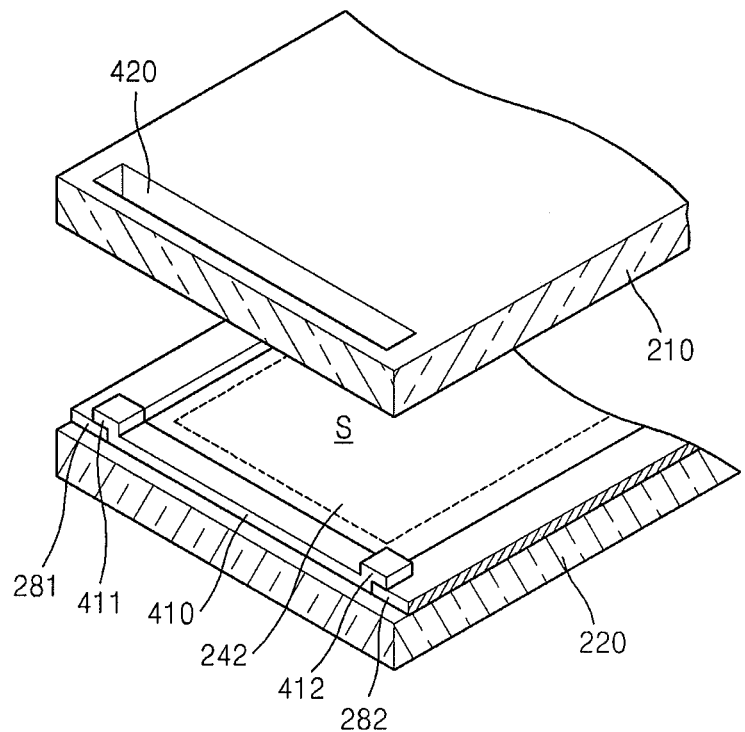
FIG. 4 is a partially enlarged perspective view of a bypass unit of the photoelectric conversion module of FIG. 2.

FIG. 4 is a partially enlarged perspective view of a bypass unit 410 of the photoelectric conversion module 200 of FIG. 2. In this embodiment, where the sealant 230 is formed and how the interconnection unit 280 electrically connects the adjacent unit photoelectric cells S have been described above, and thus only a connection structure of the bypass unit 410 will be described below.

Referring to FIGS. 2 through 4, when the second unit photoelectric cell 242 is a defective photoelectric cell, the first unit photoelectric cell 241 and the third unit photoelectric cell 243 are directly electrically connected to each other by the bypass unit 410. For this, the first interconnection unit 281 formed between the first unit photoelectric cell 241 and the second unit photoelectric cell 242, and the second interconnection unit 282 formed between the second unit photoelectric cell 242 and the third unit photoelectric cell 243, extend beyond an area where the plurality of unit photoelectric cells S are formed. For example, the first interconnection unit 281 and the second interconnection unit 282 extend up to a sealing area SA where the first sealant 231 is formed.

In addition, the bypass unit 410 electrically connects the first interconnection unit 281 and the second interconnection unit 282. The bypass unit 410 is patterned in the sealing area SA in a stripe fashion along an edge of the second unit photoelectric cell 242, which corresponds to a defective photoelectric cell. As such, the bypass unit 410 electrically connects the first unit photoelectric cell 241 and the third unit photoelectric cell 243, which are functional photoelectric cells, while bypassing the defective unit photoelectric cell 242.

A process for electrically connecting the plurality of unit photoelectric cells S by using the bypass unit 410 will be described below.

First, after the photoelectric conversion module 200 in which the plurality of unit photoelectric cells 241 through 243 are arranged is assembled, it is determined whether a defective cell exists. While the first unit photoelectric cell 241 and the third unit photoelectric cell 243 are functional photoelectric cells, when the second unit photoelectric cell 242 is determined to be a defective photoelectric cell, a bypass hole 420 is formed in any one of the light-receiving substrate 210 and the counter substrate 220. The bypass hole 420 may be formed by penetrating through any one of the light-receiving substrate 210 and the counter substrate 220 in a thickness direction. The bypass hole 420 is formed in a portion corresponding to the sealing area SA, which is outside of the second unit photoelectric cell 242. At this time, the bypass hole 420 has such a length that it may overlap with a part of the first interconnection unit 281 formed between the first unit photoelectric cell 241 and the second unit photoelectric cell 242 and a part of the second interconnection unit 282 formed between the second unit photoelectric cell 242 and the third unit photoelectric cell 243.

Next, a metal material having excellent conductivity and low viscosity such as an Ag paste is sprayed through the bypass hole 420 using a spraying device. After the metal material is sprayed, a calcination process is performed, thereby completing the bypass unit 410. The calcination process may be performed by using laser calcination.

As illustrated in FIG. 4, a first end 411 of the bypass unit 410 may at least partially overlap with an upper surface of the first interconnection unit 281, and a second end 412 may at least partially overlap with an upper surface of the second interconnection unit 282. Thus, the bypass unit 410 is electrically connected to the first interconnection unit 281 and the second interconnection unit 282. As such, when the second unit photoelectric cell 242 is determined to be a defective photoelectric cell, the counter electrode 261a of the first unit photoelectric cell 241 is electrically connected to the first interconnection unit 281, and the first interconnection unit 281 is electrically connected to the second interconnection unit 282 through the bypass unit 410, and the second interconnection unit 282 is electrically connected to the photoelectrode 251c of the photoelectrode 251c, and thus the first unit photoelectric cell 241 and the third unit photoelectric cell 243 are electrically connected to each other while bypassing the second unit photoelectric cell 242, thereby allowing smooth operation of the photoelectric conversion module 200.

Figure 5:
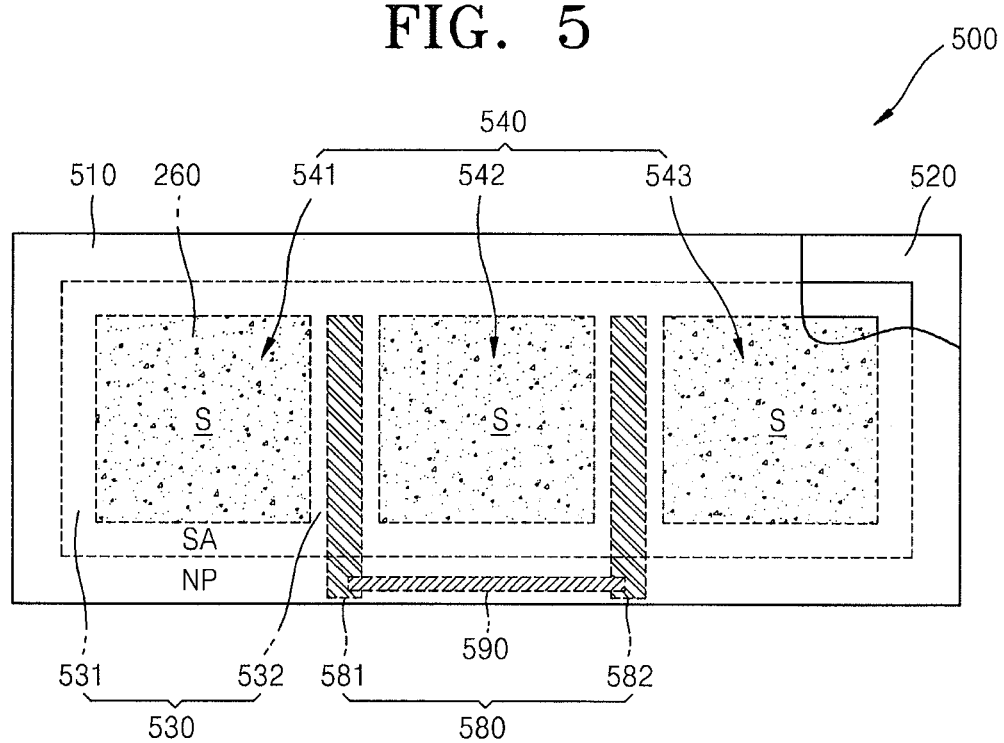
FIG. 5 is a plane view illustrating a photoelectric conversion module, according to another embodiment of the present disclosure.

FIG. 5 is a plane view illustrating a photoelectric conversion module 500 in which a plurality of unit photoelectric cells S are arranged, according to another embodiment of the present disclosure. Hereinafter, only main units of the current embodiment will be described. Referring to FIG. 5, the photoelectric conversion module 500 includes a light-receiving substrate 510 and a counter substrate 520 that face each other. A plurality of unit photoelectric cells 540 divided by a sealant 530 are formed between the light-receiving substrate 510 and the counter substrate 220. Each photoelectric cell 540 includes a first unit photoelectric cell 541, a second unit photoelectric cell 542, and a third unit photoelectric cell 543.

The first unit photoelectric cell 541, the second unit photoelectric cell 542, and the third unit photoelectric cell 543 are electrically connected to one another in series by an interconnection unit 580. The first unit photoelectric cell 541 and the second unit photoelectric cell 542 are electrically connected to each other by a first interconnection unit 581, and the second unit photoelectric cell 542 and the third unit photoelectric cell 543 are electrically connected to each other by a second interconnection unit 582. Thus, the first unit photoelectric cell 541, the second unit photoelectric cell 542, and the third unit photoelectric cell 543 are connected to one another in a Z shape. The sealant 530 includes first sealants 531 formed around the first through third unit photoelectric cells 541 through 543, and second sealants 532 formed between the first through third unit photoelectric cells 541 through 543 to divide the unit photoelectric cells S.

At this time, when the second unit photoelectric cell 542 is a defective photoelectric cell S, the first unit photoelectric cell 541 and the third unit photoelectric cell 543 are directly electrically connected to each other by a bypass unit 590. For this, the first interconnection unit 581 formed between the first unit photoelectric cell 541 and the second unit photoelectric cell 542 and the second interconnection unit 582 formed between the second unit photoelectric cell 542 and the third unit photoelectric cell 543 extend to a non-photoelectric conversion area NP outside a sealing area SA where the sealant 530 is formed. The non-photoelectric conversion area NP may be electrically connected to an external terminal (not shown).

That is, since the bypass unit 410 of FIG. 2 is formed in the sealing area SA where the sealant 430 is formed, the bypass hole 420 should be formed in the light-receiving substrate 210 or the counter substrate 220, wherein a raw material for forming the bypass unit 410 is sprayed through the bypass hole 420. Meanwhile, in the bypass unit 510 illustrated in FIG. 5, the first interconnection unit 581 and the second interconnection unit 582 are electrically connected to each other in the non-photoelectric conversion area NP outside the sealing area SA. Thus, the first unit photoelectric cell 541 and the third unit photoelectric cell 543 as functional photoelectric cells may be directly electrically connected to each other while bypassing the second unit photoelectric cell 542, which is a defective photoelectric cell, by injecting a conductive material having excellent conductivity, for example, an Ag paste, into a space between the light-receiving substrate 210 and the counter substrate 220 without forming a bypass hole for forming the bypass unit 510.

As described above, according to a photoelectric conversion module and a method of manufacturing the same of the present disclosure, when a defective photoelectric cell exists, the defective photoelectric cell is bypassed, and interconnection portions of adjacent functional photoelectric cells are connected to each other, and thus efficiency of a solar cell may be increased.

While the present invention has been described in connection with certain exemplary embodiments, it will be appreciated by those skilled in the art that various modifications and changes may be made without departing from the scope of the present disclosure. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. Thus, while the present disclosure has described certain exemplary embodiments, it is to be understood that the disclosure is not limited to the disclosed embodiments, but, on the contrary, is intended to cover various modifications and equivalent arrangements included within the spirit and scope of the appended claims, and equivalents thereof.

What is claimed is:

1. A photoelectric conversion module comprising:
  a light-receiving substrate;
  a counter substrate that faces the light-receiving substrate and is electrically connected to the light-receiving substrate;
  a first functional layer formed on the light-receiving substrate and positioned between the light-receiving and the counter substrate, the first functional layer having a photoelectrode;
  a second functional layer formed on the counter substrate and positioned between the counter substrate and the light-receiving substrate, the second functional layer having a counter electrode;
  a sealant formed between the light-receiving substrate and the counter substrate, the sealant positioned to divide a plurality of unit photoelectric cells formed between the light-receiving substrate and the counter substrate; and
  a plurality of interconnection units electrically connecting adjacent unit photoelectric cells,
  wherein when viewed from a direction perpendicular to the surface of the light-receiving substrate and the counter substrate, the light-receiving substrate and the counter substrate are divided into a photoelectric conversion area in which the unit photoelectric cells are formed, a sealing area in which the sealant is formed around a perimeter of the photoelectric conversion area, and a non-photoelectric conversion area around a perimeter of the sealing area, wherein at least two of the plurality of interconnection units are electrically connected to each other by a bypass unit, which is positioned to electrically bypass a defective unit photoelectric cell, and wherein a bypass hole is formed in the light-receiving substrate or the counter substrate so as to correspond to the bypass unit.

2. The photoelectric conversion module of claim 1, wherein each of the plurality of interconnection units comprises a first interconnection unit configured for electrically connecting a first unit photoelectric cell counter electrode and a second unit photoelectric cell photoelectrode adjacent to the first unit photoelectric cell counter electrode, and a second interconnection unit configured for electrically connecting a second unit photoelectric cell counter electrode and a third unit photoelectric cell photoelectrode adjacent to the second unit photoelectric cell counter electrode.

3. The photoelectric conversion module of claim 2, wherein, when the second unit photoelectric cell is defective, the first interconnection unit formed between the first unit photoelectric cell and the second unit photoelectric cell and the second interconnection unit formed between the second unit photoelectric cell and the third unit photoelectric cell are electrically connected to each other by the bypass unit.

4. The photoelectric conversion module of claim 3, wherein the first interconnection unit and the second interconnection unit are formed from any one of the light-receiving substrate and the counter substrate to the sealing area, and wherein ends of the bypass unit overlap with the first interconnection unit and the second interconnection unit in the sealing area so as to electrically connect the first interconnection unit and the second interconnection unit.

5. The photoelectric conversion module of claim 3, wherein the first interconnection unit and the second interconnection unit extend from any one of the light-receiving substrate and the counter substrate through the sealing area to the non-photoelectric conversion area outside of the sealing area, and wherein ends of the bypass unit overlap with the first interconnection unit and the second interconnection unit in the non-photoelectric conversion area so as to electrically connect the first interconnection unit and the second interconnection unit.

6. The photoelectric conversion module of claim 1, wherein the bypass unit comprises a silver paste.

7. The photoelectric conversion module of claim 1, wherein the sealant comprises first sealants formed around the plurality of unit photoelectric cells, and second sealants formed between adjacent unit photoelectric cells.

8. The photoelectric conversion module of claim 1, wherein the first functional layer comprises a first transparent conductive layer patterned on the light-receiving substrate and a semiconductor layer formed on the first transparent conductive layer, and wherein the second functional layer comprises a second transparent conductive layer patterned on the counter substrate and a catalyst layer formed on the second transparent conductive layer.

* * * * *